US010062725B2

(12) United States Patent
Barbier et al.

(10) Patent No.: US 10,062,725 B2
(45) Date of Patent: Aug. 28, 2018

(54) IMAGE SENSOR WITH ANTI-BLOOMING GATE

(71) Applicant: E2V SEMICONDUCTORS, Saint Egreve (FR)

(72) Inventors: Frédéric Barbier, Grenoble (FR); Frédéric Mayer, Voiron (FR)

(73) Assignee: TELEDYNE E2V SEMICONDUCTORS SAS, Saint-Égrève (FR)

( * ) Notice: Subject to any disclaimer, the term of this patent is extended or adjusted under 35 U.S.C. 154(b) by 273 days.

(21) Appl. No.: 14/770,107

(22) PCT Filed: Feb. 21, 2014

(86) PCT No.: PCT/EP2014/053436
§ 371 (c)(1),
(2) Date: Aug. 25, 2015

(87) PCT Pub. No.: WO2014/131704
PCT Pub. Date: Sep. 4, 2014

(65) Prior Publication Data
US 2016/0005785 A1    Jan. 7, 2016

(30) Foreign Application Priority Data
Feb. 28, 2013   (FR) ..................... 13 51786

(51) Int. Cl.
*H01L 27/146* (2006.01)
*H04N 5/359* (2011.01)

(52) U.S. Cl.
CPC ..... *H01L 27/14654* (2013.01); *H04N 5/3592* (2013.01); *H04N 5/3594* (2013.01); *H01L 27/14609* (2013.01)

(58) Field of Classification Search
CPC ........ H01L 27/14654; H01L 27/14609; H04N 5/3592; H04N 5/3594
See application file for complete search history.

(56) References Cited

U.S. PATENT DOCUMENTS

2005/0083421 A1* 4/2005 Berezin .................. H04N 3/155
                                                                    348/308
2011/0121162 A1   5/2011 Murata et al.
2011/0298079 A1* 12/2011 Kawahito ......... H01L 27/14603
                                                                    257/443

FOREIGN PATENT DOCUMENTS

CN    1224300 A    7/1999
EP    2107610 A2   10/2009
(Continued)

OTHER PUBLICATIONS

International Search Report for PCT/EP2014/053436, dated Mar. 27, 2014.
(Continued)

*Primary Examiner* — Renee Chavez
(74) *Attorney, Agent, or Firm* — Pilloff & Passino LLP; Sean A. Passino; Rachel K. Pilloff

(57) ABSTRACT

The invention concerns active-pixel electronic image sensors. The pixel comprises a photodiode (PH) designed in a semiconductor active layer (12) and maintained at a nil reference potential, and above the active layer an anti-blooming gate (G5) adjacent on one side to the photodiode and on another side to an evacuation drain (22). The sensor comprises means for applying to the anti-blooming gate, during most of the duration of integration, a blocking potential creating beneath the gate a potential barrier of a first height, and, during a series of brief pulses over the duration of integration, an anti-blooming potential creating a potential barrier of a second height, lower than the first. The fact of only applying the anti-blooming voltage during (Continued)

the brief pulses reduces the dark noise induced by tunneling effect by the electric field between gate and photodiode.

7 Claims, 4 Drawing Sheets

(56) References Cited

FOREIGN PATENT DOCUMENTS

| | | |
|---|---|---|
| JP | H11261896 A | 9/1999 |
| WO | 2006119333 A1 | 11/2006 |

OTHER PUBLICATIONS

English Translation of Office action in China Application No. 201480010870.5, dated Jun. 15, 2017.

* cited by examiner

IMAGE SENSOR WITH ANTI-BLOOMING GATE

FIELD

The invention relates to active-pixel electronic image sensors.

DESCRIPTION OF PRIOR ART

These sensors use an array of pixels in rows and in columns, with a photosensitive element and several transistors in each pixel.

One advantageous pixel design is a design such as that shown in FIG. 1, with:
- a pinned photodiode PH,
- a charge storage node ND, which is the equivalent of a capacitance,
- a transfer transistor T1 for insulating the photodiode from the storage node or on the contrary authorizing a transfer of charge from the photodiode to the storage node with a view to measuring the potential of the storage node after this transfer,
- a charge read-out transistor T2, assembled as a voltage follower, with its gate linked to the storage node to allow the potential of the storage node to be transferred to the transistor source,
- a storage node reset transistor T3, enabling the potential of the storage node to be set to a reference value to measure this reference potential, with a view to measuring the difference between the potentials of the storage node in the presence of charge output by the photodiode and in the absence of charge output by the photodiode;
- a pixel selection transistor T4, controlled by a row-wise addressing conductor SEL, enabling the potential of the source of the read-out transistor T2 to be transferred to a column conductor COL; the row conductor SEL is common to all the pixels of one and the same row of pixels; the column conductor COL is common to all the pixels of one and the same column of pixels,
- finally, an additional transistor T5 which can have one and/or the other of the two following functions: evacuating the excess electric charge in the photodiode in the case of excessively strong lighting, or else resetting the potential of the photodiode by completely emptying the accumulated charge so that it returns to its no-load potential before beginning a new integration period.

It will be noted that the term "transistor" is used to facilitate understanding of the electrical diagrams, such as the diagram in FIG. 1. However, in the physical design of the pixel, these transistors are not necessarily designed in the conventional manner, independently of the other elements of the pixel, with a source region, a drain region, a channel region separating the source from the drain and an insulated gate above the channel. In the real physical design of the pixel, some transistors are in reality designed essentially with an insulated gate to which a control potential can be applied. Thus, for example, the transfer transistor T1 is designed with a transfer gate G1 insulated from the substrate, lying over a region which is situated between the photodiode PH and an n$^+$-type diffusion constituting the charge storage node; the source of the transistor T1 is the photodiode; the drain of the transistor is the charge storage node.

Thus, FIG. 2 shows a section view of the physical design of the pixel, formed in a semiconductor substrate 10, of p$^+$ type for example. The substrate includes in its upper part a p-type semiconductor active layer 12 in which electrons are stored and travel.

The photodiode PH is designed with an n-type region 14 diffused in the active layer. It is preferably covered by a p$^+$-type surface region 16 of small depth, more doped than the active layer and set to the potential of the substrate, which will be considered hereinafter as a nil potential reference.

The charge storage node ND is designed with an n$^+$-type diffusion 18 in the active layer. A contact is made on its upper part for a connection to the gate of the read-out transistor T2, shown in symbol form in FIG. 2.

The transfer transistor T1 is designed with an insulated transfer gate G1 arranged above a portion of the active layer 12, between the photodiode 14 region and the diffusion 18 constituting the storage node.

The storage node reset transistor T3 is designed with an insulated gate G3 situated above the active layer 12, between the diffusion 18 and another n$^+$-type diffusion 20 which constitutes a drain set to a reference potential Vref.

The photodiode reset transistor T5 is designed with an insulated gate G5 situated above the active layer between the photodiode PH (diffused regions 14, 16) and an n$^+$-type diffusion 22 which constitutes a drain set to a reference potential which can be the same, or not the same, as the potential Vref of the diffusion 20. Here, it is considered for the sake of simplicity that the same potential Vref is involved.

Finally, the physical design of the read-out transistor T2 and of the selection transistor T4 is not shown in FIG. 2. The transistor T2 is designed with a source region, a drain region, and between the two an insulated gate; the source region is an n$^+$-type diffusion which also serves as source region for the selection transistor T4; the drain region of the transistor T2 is an n$^+$-type diffusion that is set to a supply voltage which can also be the potential Vref; the gate is linked by a conductor to the storage node ND. The transistor T4 comprises, apart from its source, a drain that is an n$^+$-type diffusion linked to the column conductor COL, and a gate that is linked to the row conductor SEL.

In this pixel, the gates G1 and G3 can serve to simultaneously reset the potential of the storage node and that of the photodiode; to do this, these gates are set to a sufficiently positive potential for all the electrons stored either in the storage node or in the photodiode to flow to the drains constituted by the regions 20 and 22. Alternatively, it is possible to reset the photodiode separately by the gate G5 and the storage node by the gate G3.

But where the gate G5 is concerned, it can be given another function which is an anti-blooming function during the times of integration of the charge resulting from the lighting of the photodiode. It is known that the electrons generated by the lighting accumulate in the photodiode and fill the potential well created in the region of the photodiode, progressively lowering the cathode potential of the latter. The level of the floor of this well is determined by the design of the photodiode (doping values, depths, etc.) The height of the edges of the potential well is determined by the height of the potential barriers that surround the photodiode; these barriers are established by the low potentials applied to the gates G1 and G5 during the charge integration periods and by the physical edges of the photodiode (generally a barrier of 0 volts due to a p or p$^+$ implantation on these edges.) The charge that accumulates in the well remains there until a pulse that lowers the potential barrier and that authorizes the passage of charge from the photodiode towards the storage node is applied to the gate G1.

However, if the lighting is strong and/or if the integration time is too long for a given lighting, it can happen that the charge completely fills the potential well before the moment when it is to be transferred; if this happens, the cathode potential drops below its anode potential. The photodiode ceases to be reverse biased, and the charge that continues to be produced by the lighting then pours directly into the active layer. It is collected by the photodiodes of the neighbouring pixels and pollutes the lighting signal measured by these pixels.

To remedy this, instead of setting the gate G5 to the lowest potential of the circuit, it is set at a slightly higher potential which lowers by a small amount the potential barrier established beneath the gate G5. Thus, when the potential well beneath the photodiode fills up, the excess charge passes above this potential barrier and pours towards the drain region 22 where it evacuates towards the connection to the potential Vref. The potential beneath the photodiode can never reach such a low value that the photodiode becomes forward biased. The excess charge leaves towards the drain at the potential Vref and does not leave towards the substrate.

The potential barrier formed beneath the gate G5 must be high enough for the potential well to be able to collect a sufficient quantity of charge for the lighting measurement, but not too high to avoid the photodiode becoming forward biased. It will be recalled that when the electric charge is electrons, which is most often the case, the potential wells formed inside the semiconductor active layer are all the deeper the higher the potentials and the potential barriers that surround them are all the higher the lower the potentials in the semiconductor. Typically, to establish the potential barrier beneath the gate G5 it is possible to choose a gate potential level, above the substrate potential, roughly equal to the threshold voltage of the transistor T5, for example around 0.6 to 1.1 volts (depending on the doping, gate insulator thicknesses, etc.)

With such a device, a drawback has however been noticed that will now be explained and which the present invention aims to remove or at least to reduce to a large extent.

If the potential applied to the gate G5 is 0.6 to 1.1 volts, the potential in the active layer 12 beneath the gate G5 will be positive, equal to around 0.2 volts for example. There then exists a strong local electric field beneath the gate at the surface of the silicon towards the edge of the photodiode which is maintained at 0 volts by the surface region 16. This electric field acts by lowering the forbidden band of the semiconductor and by therefore increasing the probability of electrons passing into the conduction band. This is a physical effect of band-to-band tunnelling, which creates a leakage current. Electrons are generated beneath the gate without the lighting being the cause; they will go to be stored in the photodiode with the highest potential. This current can be likened to a dark current since it exists independently of the lighting. This dark current, specifically due to the presence of a difference between the potential beneath the gate and the surface potential of the photodiode, is particularly bothersome when detection of weak lighting is desired. It can be several hundred times higher than if the potential beneath the gate was nil.

This phenomenon is all the stronger the further the voltage applied to the gate G5 is from zero, but the gate voltage is imposed by the level of anti-blooming desired, given the technology. If the technology gives the transistor T5 a gate voltage of 0.6 to 0.9 volts, the dark current can be very high. One solution would be to produce the transistor T5 with an almost nil threshold voltage, but that would make it necessary either to insist that all the transistors of the circuit have a nearly nil threshold voltage or to provide specific fabrication steps for producing the transistor T5.

SUMMARY

To avoid this dark current phenomenon while still having a gate that accomplishes its anti-blooming function in good conditions, the invention proposes to apply to the anti-blooming gate a positive potential supplying the anti-blooming function during a series of short pulses and not during the whole duration of integration, the gate being maintained at a nil (or even negative) potential outside of these pulses and outside of any possible reset phases of the photodiode potential. During these short pulses, the bothersome electric field exists but its effect is much weaker than if it existed during the whole duration of integration. The short pulses empty the excess charge if the lighting is strong but it is not necessary for this emptying to be continuous; it is enough that it occurs from time to time to prevent the potential well overflowing.

Consequently the invention proposes a method for controlling a pixel of an image sensor, in which each pixel of the image sensor comprises at least one photodiode formed in a semiconductor active layer by a doped region of a first type of conductivity covered by a surface region of the opposite type maintained at a nil reference potential, and an anti-blooming gate above the active layer, adjacent on one side to the photodiode and on another side to a drain for evacuating electric charge, the sensor operating periodically with in each period a determined duration of integration, this method being characterized in that the anti-blooming gate is set, during most of the duration of integration, to a blocking potential creating in the active layer beneath the gate a potential barrier of a first height, and, during a series of brief pulses over the duration of integration, to an anti-blooming potential, creating beneath the gate a potential barrier of a second height, lower than the first, this latter potential barrier retaining the charge representing the lighting in the photodiode up to a blooming threshold.

The blocking potential is preferably equal to the nil reference potential, but it could even be negative. The anti-blooming potential is positive (for a p-type active layer) and preferably lies between 0.5 and 0.9 volts. The ratio of the duration of integration to the cumulative duration of the pulses is preferably greater than or equal to 20, i.e. the pulses only occupy a small fraction of the duration of integration. The pulses are preferably periodic and the duty ratio of the period of the pulses to the duration of the pulses is then greater than or equal to 20. The period can be the read-out period of the rows of pixels of a matrix sensor in which the rows are read one after the other.

Thus, during most of the duration of integration, the phenomenon of dark current mentioned above, due to the field induced by the gate, does not occur, the potential beneath the gate remaining nil. The phenomenon only occurs during the brief anti-blooming pulses.

The invention also concerns an image sensor including an array of pixels, each pixel comprising at least one photodiode designed in a semiconductor active layer with a doped region of a first type of conductivity covered by a surface region of the opposite type maintained at a nil reference potential, and above the active layer an anti-blooming gate adjacent on one side to the photodiode and on another side to a drain for evacuating electric charge, the sensor operating periodically with in each period a determined duration of integration, the sensor being characterized in that it comprises means for applying to the anti-blooming gate, during most of the duration of integration, a blocking potential creating beneath the gate a potential barrier of a first height, and, during a series of brief pulses, an anti-blooming potential, creating beneath the gate a potential barrier of a second height, lower than the first, this latter potential barrier retaining the charge representing the lighting in the photodiode up to a blooming threshold. The active layer is preferably of p type, as well as the surface layer of the photodiode. The potential applied to the gate outside of the anti-blooming pulses is then nil (but could be negative) and the potential applied during the anti-blooming pulses is positive.

In this description, the expression "evacuation drain" as usual defines a region that eliminates charge and not a zone that stores charge with a view to taking a measurement.

It will be noted that provision has already been made in the prior art for making the anti-blooming of the photodiode by involving the transfer gate, the storage node and the storage node reset transistor (US20080122956A1, U.S. Pat. No. 8,278,131). This method disturbs the normal operation of the storage node and moreover it does not allow the pixel to be operated in any other way than the so-called "electronic rolling shutter" or ERS mode, in which the various rows of an image are not integrated at the same time.

In the patent publication US 20090127436A1, the anti-blooming gate potential level is adjusted as a function of the lighting.

In the patent publication JP H11 261896, pulses are applied to a reset gate before the moment of the integration but not during the duration of integration.

In the patent publication WO 2006/119333, pulses are applied to a charge read-out gate adjacent to a floating diffusion, but not to an anti-blooming gate adjacent to an evacuation drain.

In the patent publication 2011/121162, there is no anti-blooming gate that would receive pulses during the duration of integration.

BRIEF DESCRIPTION OF DRAWINGS

Other characteristics and advantages of the invention will appear on reading the following detailed description, made with reference to the appended drawings in which.

DESCRIPTION OF EMBODIMENTS

Figure 1:
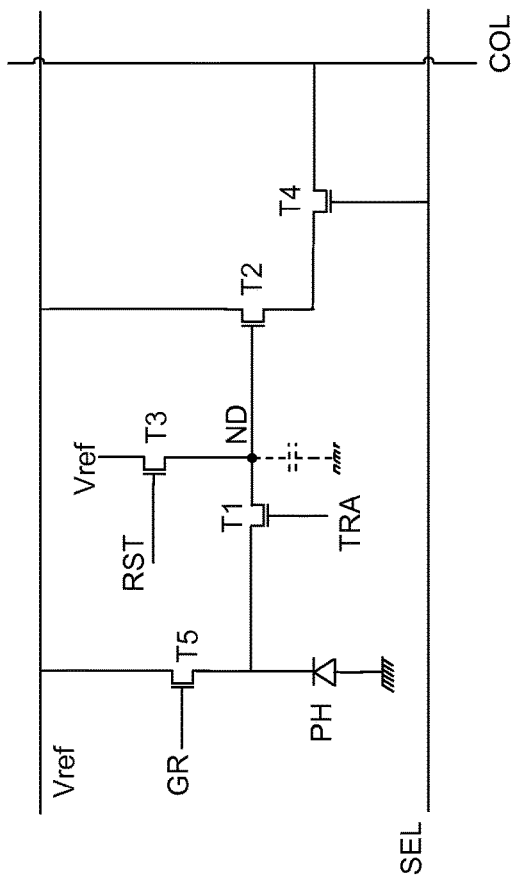
FIG. 1, already described, shows a conventional circuit diagram of a pixel with five transistors.
Figure 2:
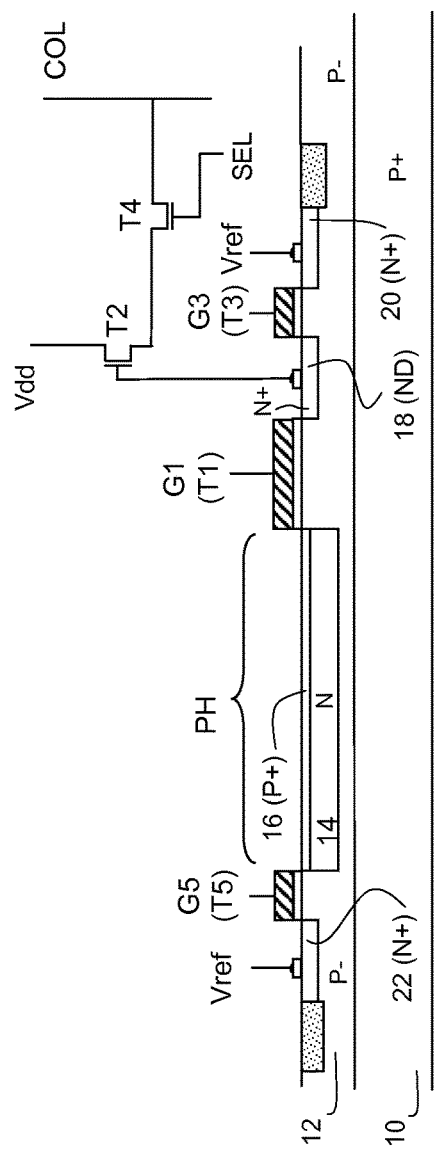
FIG. 2, already described, shows a section of the physical design of the pixel.
Figure 3:
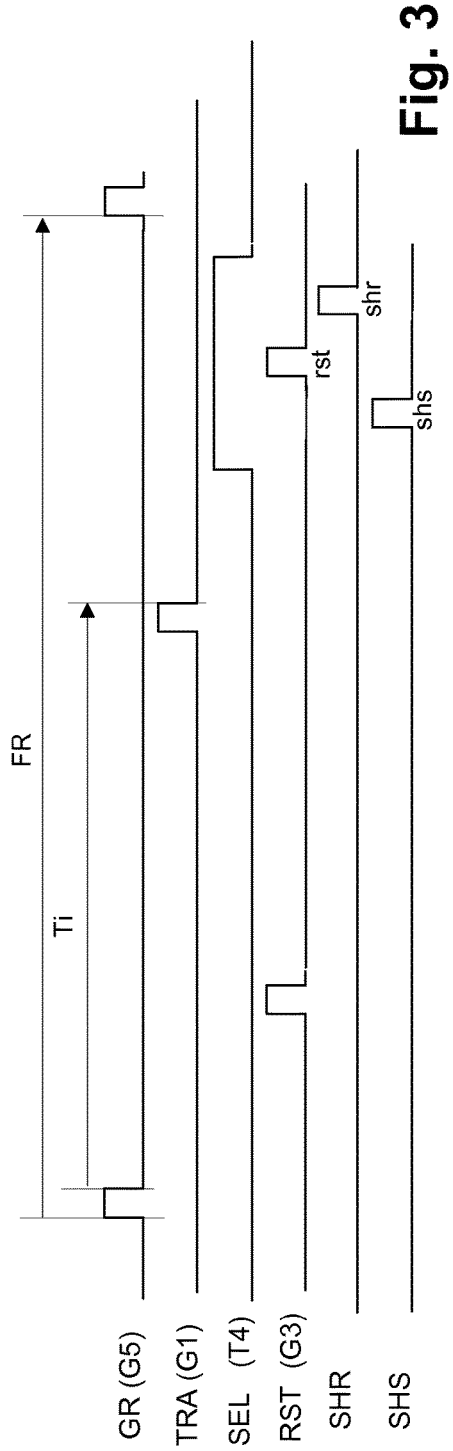
FIG. 3 shows a temporal diagram of the general operation of the pixel.

FIG. 3 shows the chronogram of the conventional operation of a pixel with 5 transistors using the fifth transistor to trigger the beginning of the integration period (operation in so-called "global shutter" mode). The operation is periodic with a frame period FR; the duration of integration is Ti less than FR. The frame starts with a reset pulse GR applied to the gate G5 of the transistor T5 for all the pixels at once. The pulse empties the charge that has been integrated by the light in the photodiodes. The end of the pulse GR marks the beginning of the duration of integration Ti, common to all the pixels. The end of this duration will be defined by the end of a transfer pulse TRA applied to the gate G1 of the transfer transistor T1; this pulse, common to all the pixels, transfers the integrated charge of the photodiode towards the storage node.

Over the course of the duration of integration, before the pulse TRA, a reset pulse (row RST) is applied to the gate G3 to empty the charge that may be contained in the storage node.

After the duration of integration Ti, the pixels are read row by row, a selection signal (row SEL) being applied successively to each of the rows to define the moment of the read-out. This signal is shown for a single row in FIG. 3; it is applied to the gate of the transistor T4. The read-out is done in a read-out circuit situated at the foot of each column and linked to the respective column conductor COL. The read-out circuit notably comprises a sampling circuit controlled by pulses shs and shr that serve to sample the level of useful potential of the column conductor after the transfer pulse TRA and the potential level after resetting, respectively. The measurement is carried out by taking the difference between the two samples at each period.

The read-out phase for a given row, defined by the slot SEL applied to this row, successively comprises the transmission of a sampling pulse shs, the transmission of a pulse RST for resetting the storage node of the pixels of the row under consideration, and the transmission of a sampling pulse shr. The difference between the sampled signals is converted by an analogue-to-digital converter.

Figure 4:
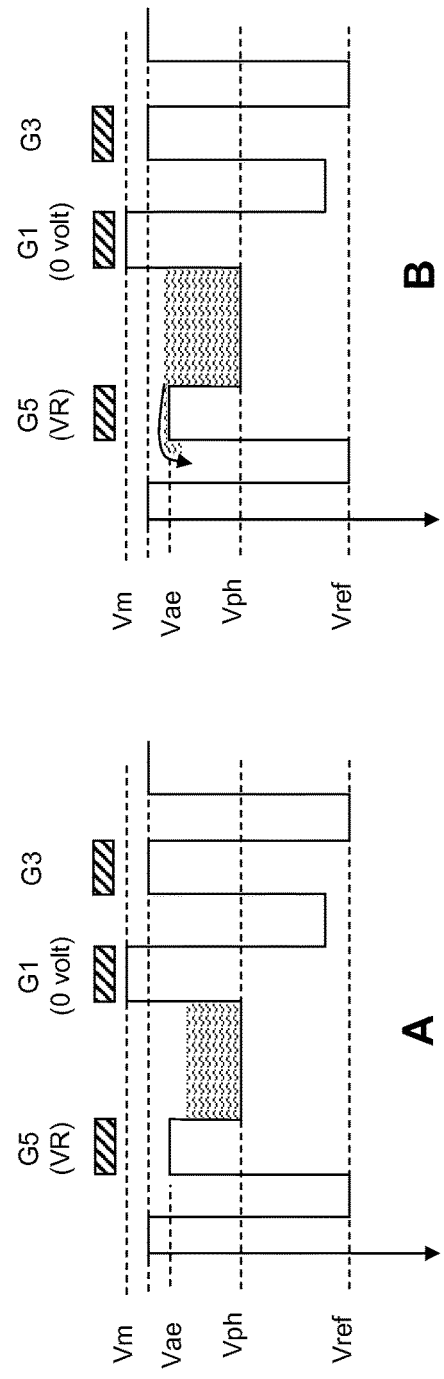
FIG. 4 shows the potential wells formed in the active layer during the duration of integration of the charge.

FIG. 4 shows the diagram of the potentials in the active layer during the integration period, in the case of normal lighting (A on the left) and in the case of excessive lighting (B on the right).

The intrinsic potential of the photodiode in the absence of photogenerated charge is a fixed level Vph that defines the bottom of the potential well formed in the photodiode. The low potential applied to the gates G1 and G5 during the integration phase gives rise to potential barriers that retain the charge of the photodiode and enable it to accumulate. The potential barrier on the side of the gate G1 is the highest, a nil potential being applied to this gate during the duration of integration Ti. To supply an anti-blooming function, the barrier on the side of the gate G5 is lower and to achieve this a positive potential VR is applied to the gate G5, for example between 0.6 and 1.1 volts. The levels of these barriers are indicated in FIG. 4 by a reference Vm (barrier beneath the gate G1) and a reference Vae (anti-blooming barrier beneath the gate G5).

In the case of excessive lighting (right-hand part of the figure) during the duration of integration, or in the case of an excessively long duration of integration, the charge can overflow from the well and it overflows on the side of the gate G5 where the barrier is lower. It is evacuated towards the drain 22 of the transistor T5 without the level of the photodiode potential running the risk of dropping below zero volts. The gate G5 is therefore definitely an anti-blooming gate which makes it possible to evacuate towards an evacuation drain, and to eliminate, excess charge to avoid it leaving towards the storage node through the transfer gate or more generally towards the silicon of the active layer.

According to the invention, to avoid the drawbacks described above, related to the existence of a non-nil potential VR on the gate G5, the gate G5 will be left nearly all the time at the zero potential during the duration of integration Ti and the anti-blooming potential VR will only be applied for short instants over the course of the duration of integration. If an overflow of charge tends to occur, these pulses will evacuate the charge.

Figure 5:
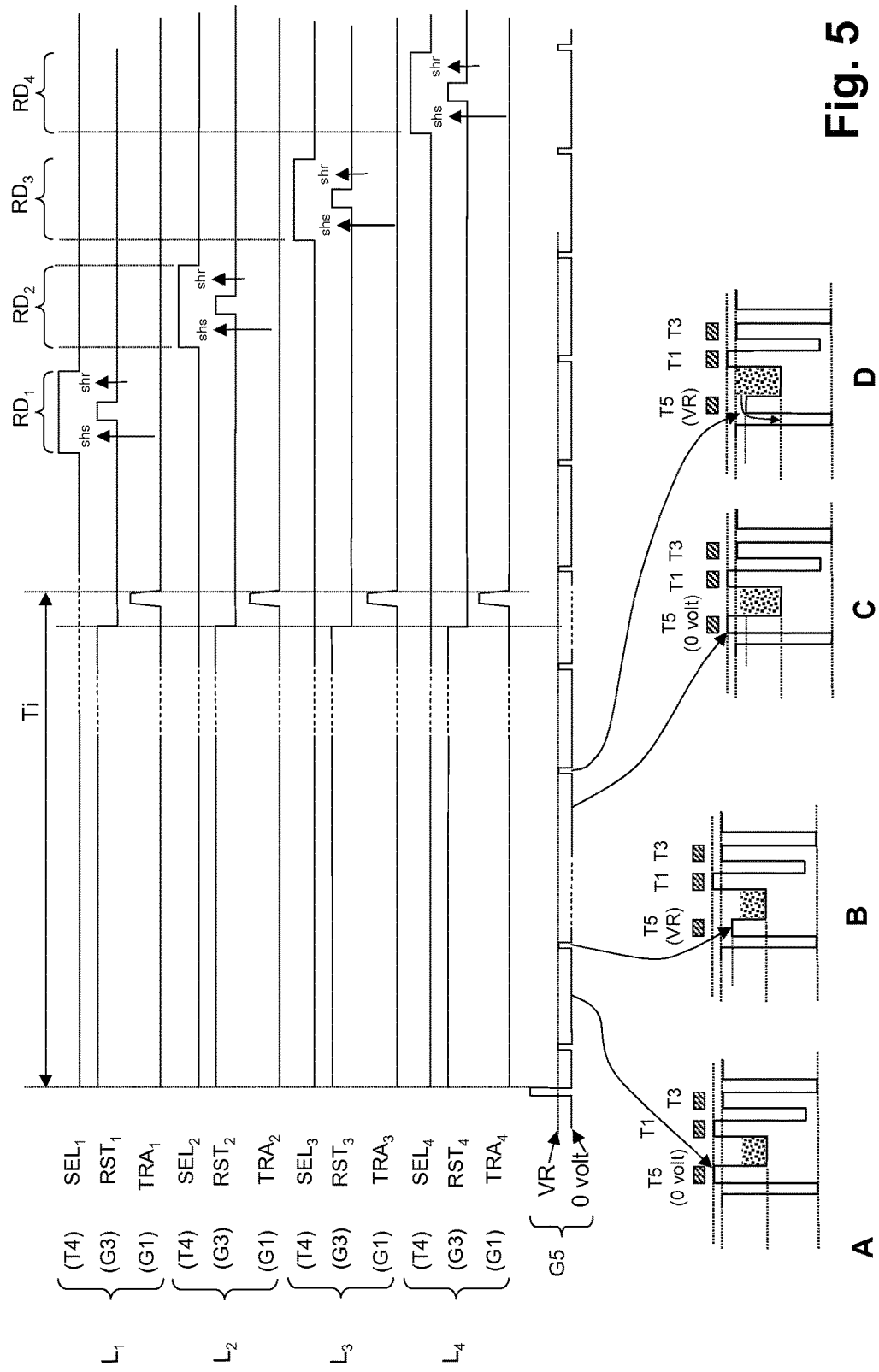
FIG. 5 shows a chronogram of the operation of the sensor according to the invention, with a representation of the potential diagrams at certain instants.

FIG. 5 shows the corresponding temporal diagram and the associated potential diagrams. The general operation, outside the anti-blooming function, is the same as in FIG. 3 but the read-out of several successive rows L1, L2, L3 and L4 is shown to clearly demonstrate the sequencing of the operations.

Outside the reset pulse GR during which the gate G5 is set to a high potential (for example 3 volts or 5 volts) to empty the charge of the photodiode and start a duration of integration Ti, the gate G5 can be set to two low potentials that are either 0 volts (or even a negative potential) or a positive potential VR (for example 0.6 volts.) The 0 volts potential is applied nearly all the time during the duration of integration; the potential VR is applied only during brief, preferably periodic pulses. The period can be the read-out period of the successive rows.

Thus, in FIG. 5 the three potentials applied to the gate G5 are seen: high positive potential at the beginning of the integration period, then 0 volts potential and a series of pulses at the low positive potential VR during the whole duration of integration. This series of pulses can also continue during the read-out phases RD1, RD2, RD3, RD4, etc. of the successive rows L1, L2, L3, L4, as is shown in FIG. 5. But it is alternatively possible to continuously apply the anti-blooming voltage VR after the transfer pulse TRA during the read-out phases because it has no drawback at that time and as long as a new integration has not started.

Four diagrams of potentials in the active layer have been drawn: diagrams A and B correspond to the case of normal lighting, without risk of overflowing. Diagrams C and D correspond to a risk of overflowing, for example towards the end of the duration of integration in the presence of fairly strong lighting. Diagram A and diagram C correspond to a moment when the gate G5 is set to the 0 potential, i.e. nearly all the time: the potential barrier beneath the gate G5 is at its highest level. Diagram B and diagram D correspond to the moment of a brief anti-blooming pulse: the potential barrier is briefly lowered. In the case of diagram D, it can be seen that any excess charge accumulated since the preceding pulse has drifted towards the drain of the transistor T5 during the brief anti-blooming pulse.

The cumulative duration of the pulses during the integration is preferably very much less than the duration of integration Ti, for example at least twenty times shorter than the duration of integration Ti.

The pulses can be applied at the row read-out frequency and the ratio of the duration of the row period to the duration of the pulse is then at least twenty. If the duration of the row period is 15 microseconds, the duration of the pulses can be around 0.5 microseconds or less. For example, for a duration of integration of 15 milliseconds, there will be a thousand anti-blooming pulses but the cumulative duration of the application of the anti-blooming voltage VR will remain thirty times shorter than the duration of integration, reducing by 30 times the generation of parasitic electrons by tunnelling effect for a given level of voltage VR.

Figure 6:
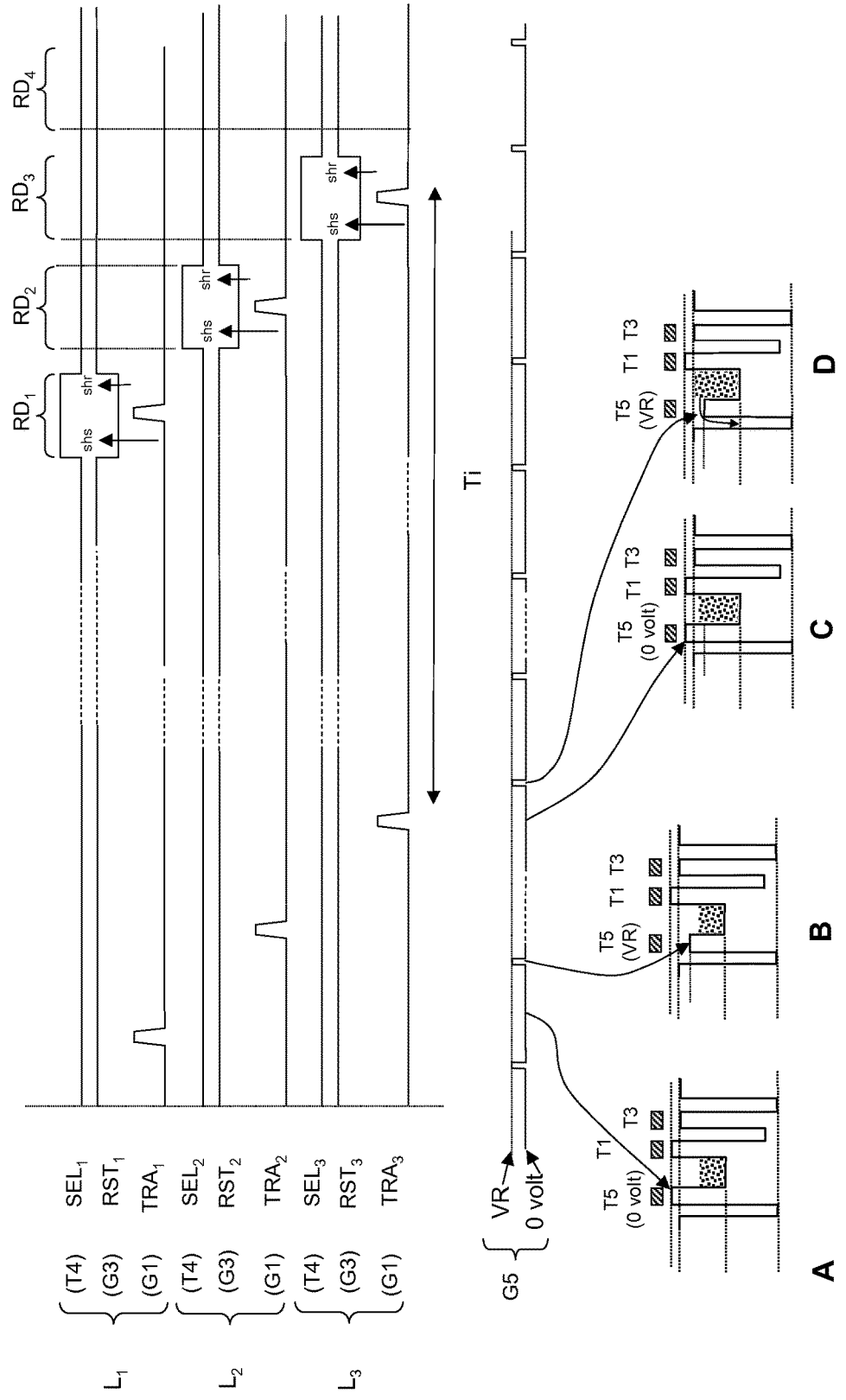
FIG. 6 shows a chronogram in another mode of operation, with the potential diagrams.

FIG. 6 shows the chronogram in the case where the duration of integration Ti is equal to the frame period and has the same value for all the rows but is offset in time from one row to the other. This is the operating mode known as Electronic Rolling Shutter or ERS. The transfer pulses applied to the gates G1 are offset in time from one row to the next. The duration of integration extends between two successive transfer pulses on the same row. The storage node is reset permanently by the gate G3 except during the read-out phase defined by a time slot SELi for a row of rank i. The read-out of the reset level (shr) takes place before the transfer pulse TRA and the read-out of the useful level takes place just after this pulse TRA. There is no longer a global transfer command GR on the gate G5 to define the beginning of an integration common to all the rows. This operating mode is used because it reduces the read-out noise due to the fact that the read-out of the reset level precedes the transfer of charge and the read-out of the useful level, which is not the case in the operating mode in FIG. 5.

In the operating mode in FIG. 6, brief pulses of positive voltage VR are applied in the same way to the gate G5 and the gate G5 is maintained at 0 volts or even at a negative voltage the rest of the time. The potential diagrams A, B, C, D are therefore the same as in FIG. 5.

In the case of FIG. 6, as the integration takes place all the time, the pulses are applied all the time, whereas in the case of FIG. 5 it was possible to predict that the pulses only take place during the time period Ti but not during the rest of the frame.

If the quantity of charge that risks making the photodiode become forward biased is Qsat and if we wish to take a margin Qmargin to evacuate the surplus charge above Qsat-Qmargin, it is possible to calculate the effectiveness of the anti-blooming system as a function of the duration of the interval that separates two successive pulses. Indeed, the efficiency limit is reached when the lighting is such that the quantity of charge produced between two successive pulses is equal to the difference Qmargin.

For example, it can be considered that: the duration of a pulse is 0.5 microseconds (but could be briefer), the period is 15 microseconds, the saturation Qsat occurs with 20,000 electrons in the photodiode, the desired margin Qmargin is 3000 electrons. Then the system is efficient up to lighting producing 200 electrons per microsecond. For example, if the integration time is chosen equal to a hundredth of a second, and if it is observed that the potential well fills up by 20,000 electrons in a hundredth of a second (2 electrons per microsecond) for a pixel that is strongly lit but at the saturation limit for this time period, then the anti-blooming system operates even if a pixel receives lighting 100 times greater. If the period of the row pulses is 30 microseconds, the limit is reached for lighting 50 times greater than that generating saturation (but there is a gain in the reduction of the noise generated by the electric field between gate and photodiode).

The invention claimed is:

1. A method for controlling a pixel of an image sensor, in which each pixel of the image sensor comprises at least one photodiode formed in a semiconductor active layer by a doped region of a first type of conductivity covered by a surface region of the opposite type maintained at a nil reference potential, a drain, and an anti-blooming gate above the active layer, adjacent on one side to the photodiode and on another side to the drain for evacuating electric charge set to a reference potential, the method comprising:

operating the sensor periodically with in each period a determined duration of integration, during said duration of integration, setting the anti-blooming gate to a main blocking potential creating, in the active layer beneath the anti-blooming gate, a first potential barrier of a first height, and generating a periodic pulsed signal applying a series of brief pulses over the duration of integration, to set periodically the anti-blooming gate to a positive anti-blooming potential creating, beneath the anti-blooming gate, a second potential barrier of a second height, lower than the first height, the second potential barrier retaining the charge representing lighting in the photodiode up to a blooming threshold, wherein a ratio of the duration of integration to a cumulative duration of the brief pulses is greater than or equal to 20, and a duty ratio of the period of the brief pulses to the duration of the brief pulses is greater than or equal to 20.

2. The method according to claim 1, wherein the blocking potential is equal to the nil reference potential.

3. The method according to claim 1, wherein the blocking potential is negative with respect to the nil reference potential.

4. The method according to claim 1, wherein the anti-blooming potential lies between 0.5 and 0.9 volts.

5. The method according to claim 1, wherein the period of the pulses is a read-out period of rows of pixels of a matrix sensor.

6. An image sensor comprising:

an array of pixels, each pixel comprising at least one photodiode in a semiconductor active layer with a doped region of a first type of conductivity covered by a surface region of the opposite type maintained at a nil reference potential, a drain, and an anti-blooming gate, above the active layer, adjacent on one side to the photodiode and on another side to the drain to evacuate electric charge set to a reference potential, wherein the sensor is configured to operate periodically with in each period a determined duration of integration, the sensor further includes circuitry configured to during said duration of integration, apply to the anti-blooming gate, a main blocking potential creating, in the active layer beneath the anti-blooming gate, a first potential barrier of a first height, generate a periodic pulsed signal applying a series of brief pulses over the duration of integration, to set periodically the anti-blooming gate to a positive anti-blooming potential creating, beneath the anti-blooming gate, a second potential barrier of a second height, lower than the first height, the second potential barrier retaining the charge representing lighting in the photodiode up to a blooming threshold, a ratio of the duration of integration to the cumulative duration of the brief pulses is greater than or equal to 20, and a duty ratio of the period of the brief pulses to the duration of the brief pulses is greater than or equal to 20.

7. The method according to claim 6, wherein the period of the pulses is a read-out period of rows of pixels of a matrix sensor.

* * * * *